(12) United States Patent
Gong et al.

(10) Patent No.: US 8,605,440 B2
(45) Date of Patent: Dec. 10, 2013

(54) SERVER RACK ASSEMBLY

(75) Inventors: Xin-Hu Gong, Shenzhen (CN); Si-Wen Shu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 667 days.

(21) Appl. No.: 12/904,684

(22) Filed: Oct. 14, 2010

(65) Prior Publication Data

US 2011/0297628 A1 Dec. 8, 2011

(30) Foreign Application Priority Data

Jun. 8, 2010 (CN) .......................... 2010 1 0195135

(51) Int. Cl.
*H05K 7/16* (2006.01)
(52) U.S. Cl.
USPC ...................................... 361/726; 361/679.58
(58) Field of Classification Search
USPC ............... 361/679.57, 679.58, 724–727, 759, 361/801; 312/330.1, 334.1, 332.1, 333, 312/223.1, 223.2, 350; 70/58, 62; 292/163, 292/174, 169, 175, DIG. 63, 137, 138
See application file for complete search history.

(56) References Cited

U.S. PATENT DOCUMENTS

| | | | | |
|---|---|---|---|---|
| 4,537,454 A * | 8/1985 | Douty et al. | ................... | 439/157 |
| 4,780,792 A * | 10/1988 | Harris et al. | ................... | 361/737 |
| 5,216,904 A * | 6/1993 | Isaki | ............................... | 70/58 |
| 5,340,340 A * | 8/1994 | Hastings et al. | ................ | 439/64 |
| 5,793,614 A * | 8/1998 | Tollbom | ........................ | 361/732 |
| 6,185,106 B1 * | 2/2001 | Mueller | ........................ | 361/798 |
| 6,267,614 B1 * | 7/2001 | Good et al. | .................... | 439/327 |
| 6,373,713 B1 * | 4/2002 | Jensen et al. | ................... | 361/759 |
| 6,826,044 B2 * | 11/2004 | Gan et al. | ................ | 361/679.58 |
| 6,961,249 B2 * | 11/2005 | Wong | ............................ | 361/801 |
| 6,992,900 B1 * | 1/2006 | Suzue et al. | ................... | 361/801 |
| 7,125,272 B1 * | 10/2006 | Liang | ............................ | 439/160 |
| 7,443,668 B2 * | 10/2008 | Hsu | ........................ | 361/679.33 |
| 7,995,354 B2 * | 8/2011 | Wu et al. | ........................ | 361/801 |
| 8,059,427 B2 * | 11/2011 | Peng et al. | .................... | 361/814 |
| 8,416,563 B2 * | 4/2013 | Hou | ......................... | 361/679.33 |
| 2004/0264146 A1 * | 12/2004 | Kerrigan et al. | ............... | 361/726 |
| 2006/0110959 A1 * | 5/2006 | Shen et al. | .................... | 439/136 |
| 2007/0258224 A1 * | 11/2007 | Fang | ............................ | 361/759 |
| 2008/0013288 A1 * | 1/2008 | Karstens | ........................ | 361/726 |
| 2008/0025000 A1 * | 1/2008 | Huang et al. | ................... | 361/726 |
| 2009/0086456 A1 * | 4/2009 | Milo et al. | .................... | 361/801 |
| 2009/0284915 A1 * | 11/2009 | Tsai et al. | ................ | 361/679.58 |

* cited by examiner

*Primary Examiner* — Darnell Jayne
*Assistant Examiner* — Hiwot Tefera
(74) *Attorney, Agent, or Firm* — Altis Law Group, Inc.

(57) ABSTRACT

A server rack assembly includes a rack, a chassis, and a locking device. The rack has two side plates each defining a receiving slot. The chassis receives an electronic component, and is received between the side walls. The locking device includes a bracket, a locker, and two elastic members. The bracket is positioned at an end of the chassis and adjacent to the receiving slot. The locker is fixed to the center of the bracket. The two elastic members are fixed to two opposite ends of the bracket. Each elastic member includes a protrusion and a locking piece at two opposite ends thereof. The elastic member is capable of rotating between a first position where the locker locks the locking piece and the protrusion is received in the receiving slot, and a second position where the locker unlocks the locking piece and the protrusion is released from the receiving slot.

19 Claims, 5 Drawing Sheets

SERVER RACK ASSEMBLY

BACKGROUND

1. Technical Field

The present disclosure relates to rack assemblies and, particularly, to a rack assembly for housing electronic components of a server.

2. Description of Related Art

Servers usually include a server rack assembly and a number of rack-mount computers. The rack assembly generally includes a rack and a number of removable chassis for receiving the rack-mount computers. In assembly, the chassis is housed in the rack and is fixed to the rack with a locking device. However, electrical connections between the rack-mount computers received in the chassis and connection ports of the rack may not be properly established due to improper assembly or vibrations after the assembly. As a result, the server may not work properly.

Therefore, it is desirable to provide a new server rack assembly, which can overcome the above-mentioned limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail with reference to the drawings.

Figure 1:
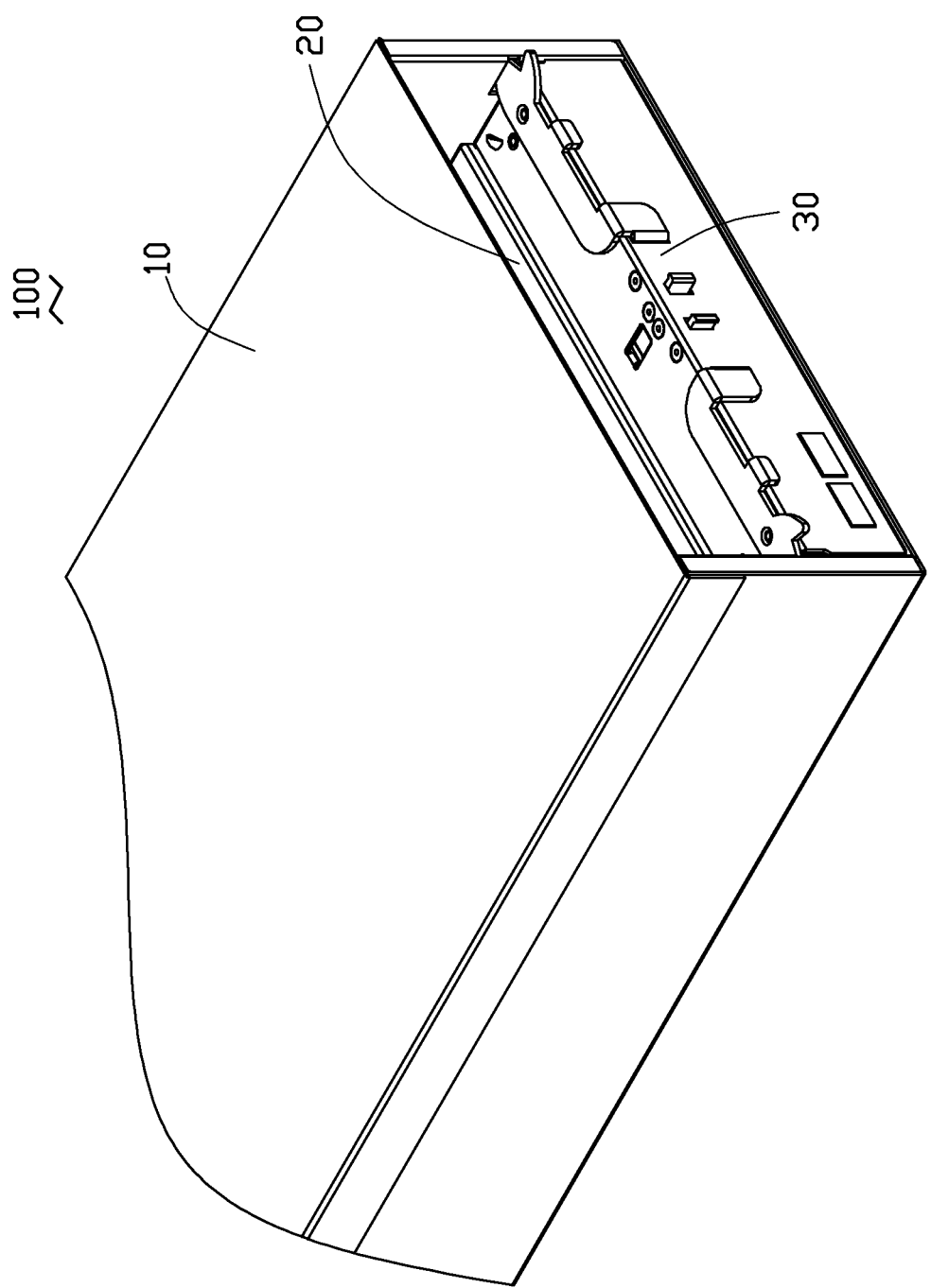
FIG. 1 is an isometric, assembled view of a server rack assembly, according to an exemplary embodiment.
Figure 2:
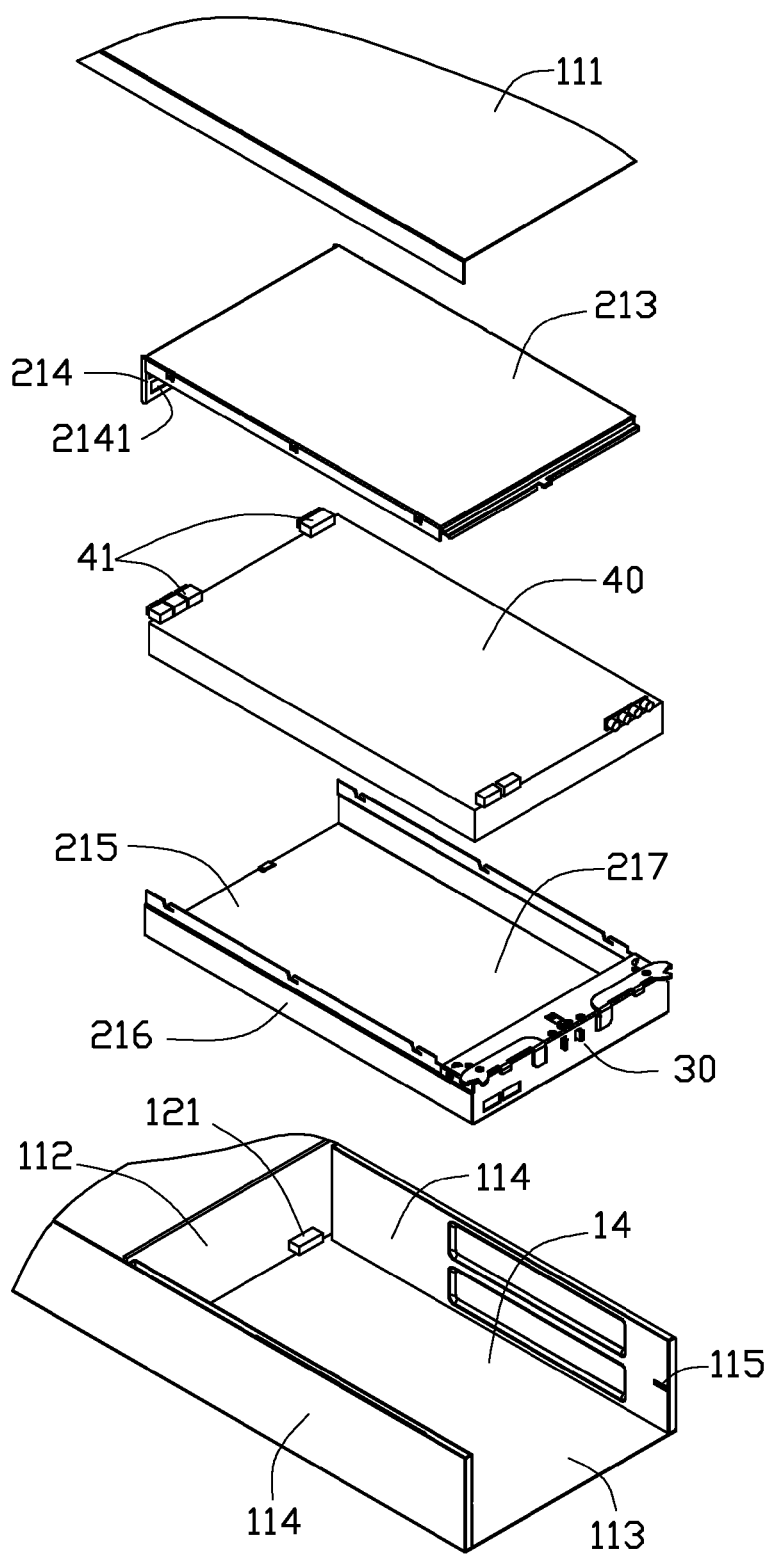
FIG. 2 is an exploded view of the server rack assembly of FIG. 1.

Referring to FIGS. 1 and 2, a server rack assembly 100, according to an exemplary embodiment, is for housing a computer 40. The rack assembly 100 includes a rack 10, a chassis 20, and a locking device 30.

The rack 10 includes a bottom plate 113, two side plates 114, a top plate 111, and a back plate 112. In the present embodiment, the bottom plate 113, two side plates 114, and the back plate 112 is one-piece or integrally formed. The two side plates 114 each extend upwards from two opposite ends of the bottom plate 113 and define a receiving slot 115 at an end thereof. The top plate 111 is connected to the two side plates 114 with screws (not shown), opposing the bottom plate 113. The back plate 112 contacts an end of each of the side plates 114 that is distant from the receiving slot 115 and forms a number of first connection ports 121 thereon. The rack 10 defines a first cavity 14 for receiving the chassis 20. The first connection ports 121 are located between the two side plates 114, received in the first cavity 14.

The chassis 20 includes a bottom wall 215, two side walls 216 extending upwards from two opposite ends of the bottom wall 215, a top wall 213, and a back wall 214 extending downwards from an end of the top wall 213. In the present embodiment, the bottom wall 215 and two side walls 216 are one-piece or integrally formed, the top wall 213 and the back wall 214 is also one-piece or integrally formed. The back wall 214 defines a number of connection slots 2141 corresponding to the first connection parts 121 of the rack 10. The top wall 213 is connected to two side walls 216, opposing the bottom wall 215, with the back wall 214 connected to an end of each side wall 216. The chassis 20 defines a second cavity 217 for housing the computer 40.

Figure 3:
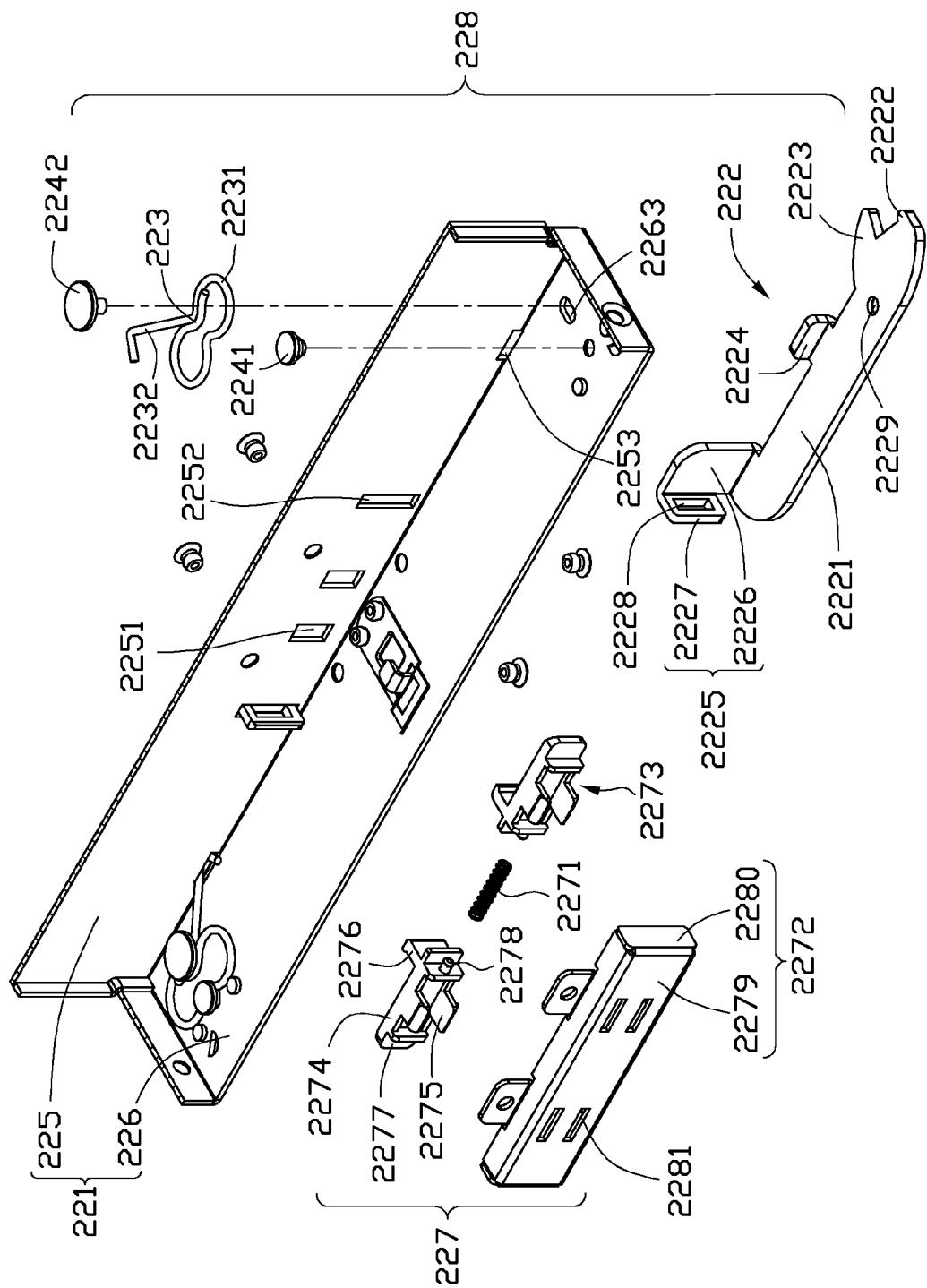
FIG. 3 is an exploded view of a locking device of the server rack assembly of FIG. 1.
Figure 4:
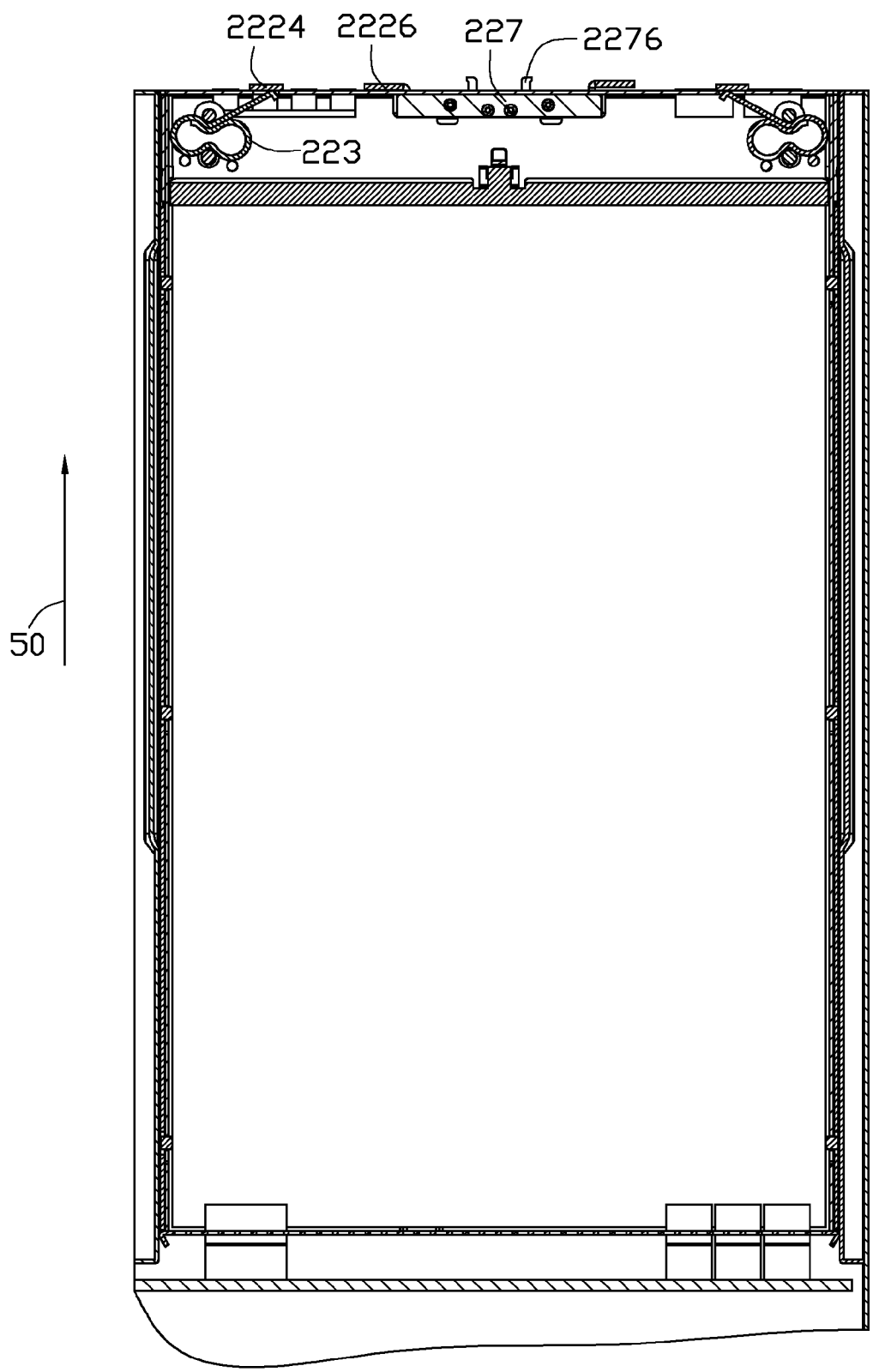
FIG. 4 is a top, cross-sectional view of the server rack assembly of FIG. 1.

Referring to FIGS. 2 to 4, the locking device 30 is connected to the end of the chassis 20 that is opposite to the back wall 214. The lock device 30 includes a bracket 221, a locker 227 fixed to the center of the bracket 221, and two elastic members 228, each of which is fixed at the corresponding opposite ends of the bracket 221.

The bracket 221 includes a first plate 225 for sealing the second cavity 217 and a second plate 226 substantially perpendicularly connected to an edge of the first plate 225. The first plate 225 defines two first slots 2251, two second slots 2252, and two third slots 2253. The first slots 2251, the second slots 2252, and the third slots 2253 are substantially symmetrical with respect to the center of the first plate 225. The first slots 2251 are positioned between the second slots 2252. The second slots 2252 are positioned between the third slots 2253. The third slots 2253 are formed at an edge of the first plate 225, adjacent to the second plate 226. The second plate 226 forms two strip slots 2263 whose lengthwise direction is substantially perpendicular to the first plate 225.

The locker 227 is fixed to the center of the first plate 225 and includes two shafts 2273, a helical spring 2271 interconnecting the two shafts 2273, and a shell 2272 receiving the shafts 2273 and the helical spring 2271. In detail, the shaft 2273 includes a main body 2274, two positioning portions 2275 substantially parallel to each other, an operating portion 2276, a locking portion 2277, and a connecting portion 2278. The positioning portion 2275 and the operating portion 2276 extend outwards from two opposite sides of the main body 2274. The locking portion 2277 and the connecting portion 2278 extend from two opposite ends of the main body 2274. The helical spring 2271 engages with both connecting portions 2278. The shell 2272 includes a rectangular bottom plate 2279 and four side plates 2280 surrounding the bottom plate 2279. The bottom plate 2279 defines four positioning slots 2281 along the lengthwise direction thereof, corresponding to the positioning portions 2275.

In assembly, the positioning portions 2275 are inserted through the corresponding positioning slots 2281 of the shell 2272, while the operating portion 2276 protrudes out of the first slot 2251 of the first plate 225. The two shafts 2273 and the helical spring 2271 are received in the shell 2272. The shell 2272 is fixed to the first plate 225 with screws (not labled). In this situation, the shaft 2273 is capable of moving along the positioning slot 2281 when the operating portion 2276 is operated. In a normal state (no external force is applied to the operating portion), the locking portion 2277 seals the second hole 2252.

The elastic member 228 includes a hook 222, an elastic piece 223, a first rivet 2241, and a second rivet 2242. The hook 222 includes a substantially rectangular rotating board 2221, a protrusion 2222, a block 2223, a resisting portion 2224, and a locking piece 2225. The protrusion 2222 extends from a first end (not labeled) of the rotating board 2221. The block 2223 protrudes from the first end of the rotating board 2221, and is adjacent to the protrusion 2222. The resisting portion 2224 extends upwards from an edge of the rotating board 2221. The locking piece 2225 includes an operating plate 2226 and a locking plate 2227. The operating plate 2226 extends upwards from a second end (not labeled) opposite to the first end of the rotating board 2221. The locking plate 2227 substantially perpendicularly extends from the edge of the operating plate 2226 that is away from the protrusion 2222. The locking plate 2227 defines a locking slot 2228 therethrough, corresponding to the locking portion 2277 of the shaft 2273. The rotating board 2221 forms a fixing hole 2229 between the protrusion 2222 and the resisting portion 2224.

The elastic piece 223 includes a fixing portion 2231 and an elastic portion 2232. The fixing portion 2231 is substantially "FIG. 8" shaped. The elastic portion 2232 is substantially "L" shaped, slanting outward from the middle of the fixing portion 2231. In assembly, the first rivet 2241 is mounted on the second plate 226, near the strip slot 2263. The second rivet 2242 runs through the strip slot 2263 and is mounted to the fixing hole 2229, with the fixing portion 2231 of the elastic piece 223 intervened between the first and second rivets 2241 and 2242. In this case, the elastic portion 2232 of the elastic piece 223 is resisted at the third slot 2253 of the first plate 225, and partially protrudes out of the third slot 2253. Meanwhile, guided by the second rivet 2242, the hook 222 can move along the strip slot 2263. The locking device 30 is connected to the chassis 20 by screws (not labeled).

Referring to FIGS. 1 to 4, in operation, the computer 40 is received in the second cavity 217 of the chassis 20. Then the top wall 213 and the back wall 214 cover the computer 40, with a number of second connection parts 41 of the computer 40 extending out of the connection slots 2141. The chassis 20 is then arranged in the first cavity 14 of the rack 10, thereby the second connection parts 41 are connected to the first connection ports 121 of the rack 10. After that, an external force pushes the operating plate 2226, so that the hook 222 rotates about the second rivet 2242. The locking plate 2227 then passes through the second slot 2252, and is locked in the locker 227 by the engagement of the locking portion 2277 and the locking slot 2228. Meanwhile, the resisting portion 2224 seals the third slot 2253, the protrusion 2222 is then engaged with the receiving slot 115 of the rack 10. Thereby, the computer 40, the lock device 30 and the chassis 20 is locked in the rack 10.

In this situation, the elastic portion 2232 of the elastic piece 223 resists the resisting portion 2224 of the hook 222, generating a force between the elastic piece 223 and the resisting portion 2224. As the hook 222 engages with the receiving slot 115, which makes it unable to move along the direction shown as the arrow 50, and the second rivet 2242 can move along the strip slot 2263, the force generated by the elastic piece 223 then forces the locking device 30 and the chassis 20 to move along the strip slot 2263, opposite to the arrow 50. Therefore, when vibration or inaccuracy in the process of fixing the chassis 20 into the rack 10 occurs, the chassis 20 will move towards the first connection ports 121 automatically, which ensures a reliable connection between the first and the second connection ports 121 and 41.

Figure 5:
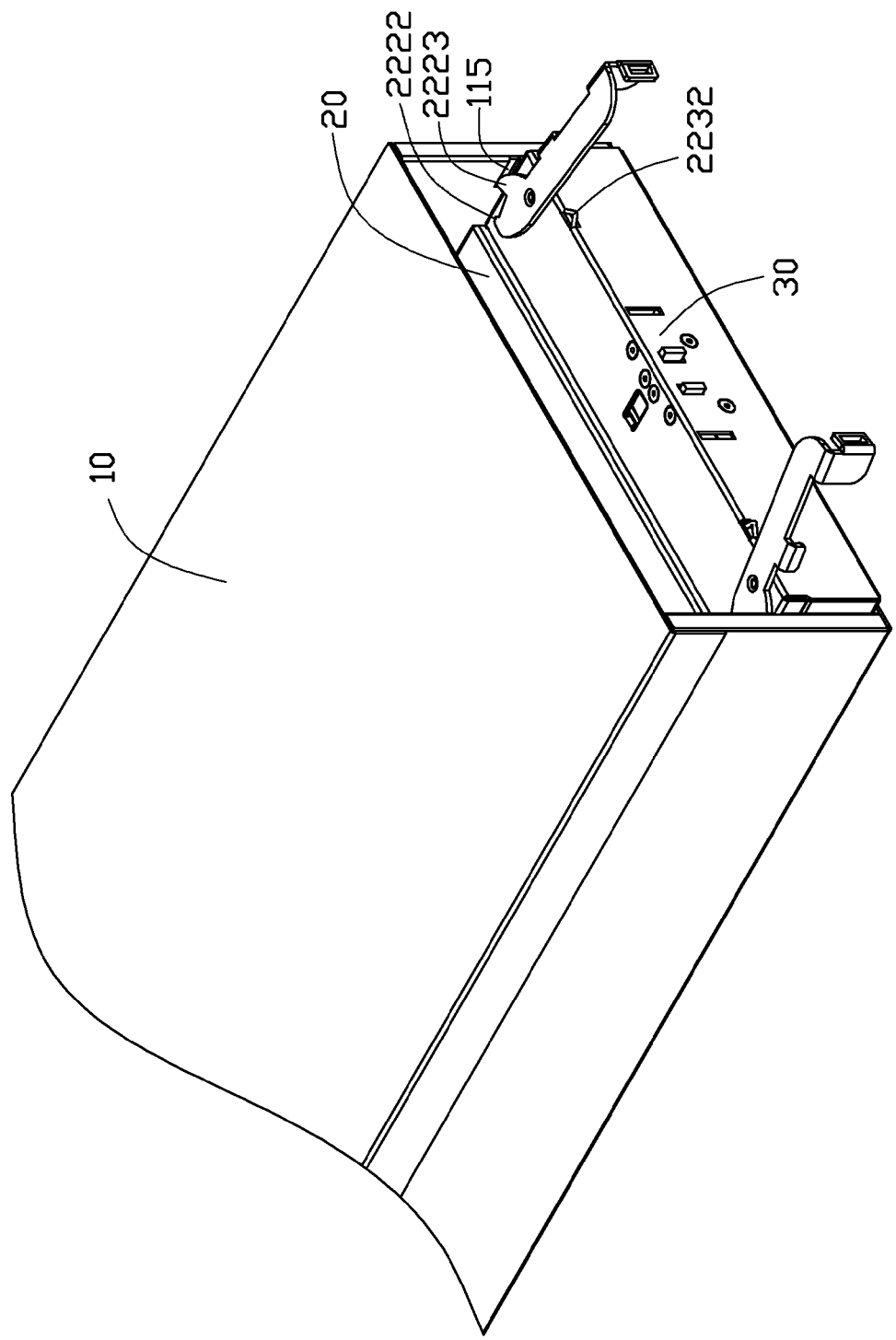
FIG. 5 is similar to FIG. 1, but showing another state of the server rack assembly.

Also referring to FIG. 5, when taking out the chassis 20, the two operating portions 2276 of the two shafts 2273 are pushed towards each other. Then the locking portion 2277 slides out of the locking slot 2228 of the hook 222. Resisted by the elastic portion 2232 of the elastic piece 223, the resisting portion 2224 bounces off the third slot 2253, which makes the locking plate 2227 come out of the second slot 2252 automatically. During the locking plate 2227 coming out of the second slot 2252, the block 2223 of the hook 222 resists the end of the receiving slot 115 away from the locking device 30.

Under the counterforce of the side wall 216, the chassis 20 can be easily taken out of the rack 10.

It should be understood that the chassis 20 could also be used for housing other electronic components, not limited to computers 40.

It will be understood that the above particular embodiments is shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A server rack assembly, comprising:
a rack having two side plates, each side plate defining a receiving slot at one end thereof;
a chassis received in the rack and defining a first cavity for receiving an electronic component; and
a locking device positioned on an end of the chassis and adjacent to the receiving slot, the locking device comprising:
a bracket having a first plate sealing the cavity and a second plate extending from an edge of the first plate, wherein the first plate defines two first slots at an edge of the first plate, the two first slots are adjacent to the second plate, the second plate defines two strip slots whose lengthwise directions are substantially perpendicular to the first plate, the two strip slots positioned at two opposite ends of the second plate;
a locker positioned on the center of the first plate; and
two elastic members positioned on two opposite ends of the second plate, each elastic member comprising:
a hook having a locking piece configured to engage with the locker, a protrusion corresponding to the receiving slot of the rack, and a resisting portion extending from an edge thereof, the locking piece and the protrusion positioned at two opposite ends of the hook, the resisting portion configured to cover the first slot of the first plate, the hook defining a fixing hole between the protrusion and the resisting portion,
an elastic piece positioned on an end of the second plate, and comprising an elastic portion protruding out of the first slot of the first plate and configured to resist against the resisting portion, and
a first rivet passing through the strip slot and fixed to the fixing hole through to secure the hook to the second plate, wherein the elastic piece comprises a fixing portion and the elastic portion, the fixing portion is substantially "8" shaped, the elastic portion is "L" shaped and slants outwardly from the middle of the fixing portion; a second rivet is mounted on the second plate near the strip slot, the fixing portion of the elastic piece is intervened between the first and second rivets.

2. The server rack assembly of claim 1, wherein the rack further comprises a bottom plate and a top plate, the bottom plate and the top plate are connected with the two side plates and opposite to each other, opposing each other, the rack defines a second cavity between the bottom plate, the top plate and the two side plates, the second cavity receives the chassis.

3. The server rack assembly of claim 1, wherein the rack further comprises a back plate connected an end of each side plate, the back plate forms a plurality of first connection ports, the connection ports are located between the two side plates and configured to connect the electronic component.

4. The server rack assembly of claim 3, wherein the chassis comprises a bottom wall, two side walls extending upwards from two opposite sides of the bottom wall, a top wall connected to the two side walls and opposing the bottom wall, and a back wall extending downwards from an end of the top wall, the back wall defines a number of connection slots corresponding to the first connection parts of the rack, the first cavity is defined between the bottom wall, the two side walls, the top wall, and the back wall.

5. The server rack assembly of claim 1, wherein the first plate defines two second slots and two third slots, the third slots are positioned between the two second slots, the two second slots are positioned between the two first slots.

6. The server rack assembly of claim 5, wherein the locker comprises two shafts configured for locking the locking piece of the hook, a helical spring connecting to the two shafts, and a shell receiving the shafts and the helical spring, the shell is fixed to the first plate.

7. The server rack assembly of claim 6, wherein each of the two shafts comprises a main body, a positioning portion, an operating portion, a locking portion, and a connecting portion; the positioning portion and the operating portion extend from two opposite sides of the main body, the locking portion and the connecting portion extend from two another opposite ends of the main body; the shell comprises a bottom plate and four side plates surrounding the bottom plate, the bottom plate defines two positioning slots; the helical spring engages with the connecting portions of the two shafts, the operating portion of each shaft protrudes out of a corresponding third slot of the first plate and is capable of moving in the corresponding third slot, the positioning portion of each shaft is received in a corresponding positioning slot and capable of moving in the corresponding positioning slot, the locking piece is configured to pass through a corresponding second slot and be locked by a corresponding locking portion.

8. The server rack assembly of claim 1, wherein the hook further comprises a substantially rectangular rotating board, the locking piece comprises an operating plate extending from one end of the rotating board, and a locking plate extending from the edge of the operating plate that is away from the protrusion, the locking plate defines a locking slot therethrough for being locked by the locker, the protrusion extends from the other end of the rotating board, the resisting portion extends upwards from an edge of the rotating board, the fixing hole is defined in the rotating board.

9. The server rack assembly of claim 8, wherein the hook further comprises a block protruding from the rotating board, the block is adjacent to the protrusion.

10. The server rack assembly of claim 1, wherein the first rivet is capable of moving in the strip slot.

11. A server rack assembly, comprising:
a rack having two side plates, each side plate defining a receiving slot at one end thereof;
a chassis received in the rack and defining a first cavity for receiving an electronic component; and
a locking device positioned on an end of the chassis and adjacent to the receiving slot, the locking device comprising:
a bracket having a first plate sealing the cavity and a second plate extending from an edge of the first plate, wherein the first plate defines two first slots at an edge of the first plate, the two first slots are adjacent to the second plate, the second plate defines two strip slots whose lengthwise directions are substantially perpendicular to the first plate, the two strip slots positioned at two opposite ends of the second plate;
a locker positioned on the center of the first plate; and
two elastic members positioned on two opposite ends of the second plate, each elastic member comprising:
a hook having a locking piece configured to engage with the locker, a protrusion corresponding to the receiving slot of the rack, and a resisting portion extending from an edge thereof, the locking piece and the protrusion positioned at two opposite ends of the hook, the resisting portion configured to cover the first slot of the first plate, the hook defining a fixing hole between the protrusion and the resisting portion,
an elastic piece positioned on an end of the second plate, and comprising an elastic portion protruding out of the first slot of the first plate and configured to resist against the resisting portion, and
a first rivet passing through the strip slot and fixed to the fixing hole through to secure the hook to the second plate, wherein the locker comprises two shafts configured for locking the locking piece of the hook, a helical spring connecting to the two shafts, and a shell receiving the shafts and the helical spring, the shell is fixed to the first plate.

12. The server rack assembly of claim 11, wherein the rack further comprises a bottom plate and a top plate, the bottom plate and the top plate are connected with the two side plates and opposite to each other, opposing each other, the rack defines a second cavity between the bottom plate, the top plate and the two side plates, the second cavity receives the chassis.

13. The server rack assembly of claim 11, wherein the rack further comprises a back plate connected an end of each side plate, the back plate forms a plurality of first connection ports, the connection ports are located between the two side plates and configured to connect the electronic component.

14. The server rack assembly of claim 13, wherein the chassis comprises a bottom wall, two side walls extending upwards from two opposite sides of the bottom wall, a top wall connected to the two side walls and opposing the bottom wall, and a back wall extending downwards from an end of the top wall, the back wall defines a number of connection slots corresponding to the first connection parts of the rack, the first cavity is defined between the bottom wall, the two side walls, the top wall, and the back wall.

15. The server rack assembly of claim 11, wherein the first plate defines two second slots and two third slots, the third slots are positioned between the two second slots, the two second slots are positioned between the two first slots.

16. The server rack assembly of claim 15, wherein each of the two shafts comprises a main body, a positioning portion, an operating portion, a locking portion, and a connecting portion; the positioning portion and the operating portion extend from two opposite sides of the main body, the locking portion and the connecting portion extend from two another opposite ends of the main body; the shell comprises a bottom plate and four side plates surrounding the bottom plate, the bottom plate defines two positioning slots; the helical spring engages with the connecting portions of the two shafts, the operating portion of each shaft protrudes out of a corresponding third slot of the first plate and is capable of moving in the corresponding third slot, the positioning portion of each shaft is received in a corresponding positioning slot and capable of moving in the corresponding positioning slot, the locking piece is configured to pass through a corresponding second slot and be locked by a corresponding locking portion.

17. The server rack assembly of claim 11, wherein the hook further comprises a substantially rectangular rotating board, the locking piece comprises an operating plate extending from one end of the rotating board, and a locking plate extending from the edge of the operating plate that is away from the protrusion, the locking plate defines a locking slot therethrough for being locked by the locker, the protrusion extends from the other end of the rotating board, the resisting portion extends upwards from an edge of the rotating board, the fixing hole is defined in the rotating board.

18. The server rack assembly of claim 17, wherein the hook further comprises a block protruding from the rotating board, the block is adjacent to the protrusion.

19. The server rack assembly of claim 11, wherein the first rivet is capable of moving in the strip slot.

* * * * *